(12) United States Patent
Lee et al.

(10) Patent No.: US 7,800,100 B2
(45) Date of Patent: Sep. 21, 2010

(54) DISPLAY DEVICE INCLUDING A BEAD LAYER AND FABRICATING METHOD THEREOF

(75) Inventors: Sang pil Lee, Seoul (KR); Un cheol Sung, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 994 days.

(21) Appl. No.: 11/555,345

(22) Filed: Nov. 1, 2006

(65) Prior Publication Data

US 2007/0096642 A1 May 3, 2007

(30) Foreign Application Priority Data

Nov. 1, 2005 (KR) ...................... 10-2005-0103746

(51) Int. Cl.
*H01L 51/30* (2006.01)
(52) U.S. Cl. .................. 257/40; 257/E51.019; 313/504
(58) Field of Classification Search .................... 257/40, 257/98, E51.019, E51.021; 313/504
See application file for complete search history.

(56) References Cited

U.S. PATENT DOCUMENTS

2001/0000744 A1* 5/2001 Wolk et al. .................. 430/200
2005/0194896 A1* 9/2005 Sugita et al. ................. 313/506
2005/0205863 A1 9/2005 Choi et al.

FOREIGN PATENT DOCUMENTS

| CN | 1575056 A | 2/2005 |
|---|---|---|
| JP | 05273512 | 10/1993 |
| JP | 11126685 | 5/1999 |
| JP | 2004-117433 A | 4/2004 |
| JP | 2004-127560 A | 4/2004 |
| JP | 2005100943 A | 4/2005 |
| JP | 2005-227519 A | 8/2005 |
| JP | 2005251488 A | 9/2005 |
| JP | 2005-283832 A | 10/2005 |

OTHER PUBLICATIONS

Korean Intellectual Property Office Notice of Official Action; 10-2005-0103746; Jan. 15, 2007 All the references cited in the Search Report are listed above.

* cited by examiner

*Primary Examiner*—Thomas L Dickey
(74) *Attorney, Agent, or Firm*—Cantor Colburn LLP

(57) ABSTRACT

A display device including a insulating substrate, an organic layer disposed on the insulating substrate, a common electrode disposed on the organic layer and a bead layer including a plurality of beads through which light from the organic layer passes. A method of fabricating a display device, the method including forming an organic film on a insulating substrate, forming a first transparent electrode layer on the organic film and forming a bead layer including a plurality of beads on the first transparent electrode layer.

17 Claims, 8 Drawing Sheets

DISPLAY DEVICE INCLUDING A BEAD LAYER AND FABRICATING METHOD THEREOF

This application claims priority to Korean Patent Application No. 2005-0103746, filed on Nov. 1, 2005, and all the benefits accruing therefrom under 35 U.S.C. §119, the contents of which are incorporated herein by reference in its entirety.

BACKGROUND OF THE INVENTION

1. Field of the Invention

The present invention relates to a display device and a fabricating method thereof, and more particularly, to a display device and a fabricating method thereof, which comprises a bead layer for diffusing light, thereby improving optical efficiency thereof.

2. Description of the Related Art

Among flat panel displays, an organic light emitting diode ("OLED") has attracted attention because it is driven with a low voltage, is thin and light, has a wide view angle, has a relatively short response time, etc.

In an active matrix OLED, a thin film transistor is connected to every pixel region and controls emission of an organic emission layer according to the pixel region. Each pixel region includes a pixel electrode, and each pixel electrode is electrically disconnected from adjacent pixel electrodes so that each pixel can be driven independently. A partition wall is formed between the pixel regions. The partition wall prevents the pixel electrodes from being short-circuited therebetween, thereby separating the pixel regions from each other. A hole injecting layer and an organic emission layer are formed in sequence on the pixel electrode between the partition walls. On the organic emission layer is formed a common electrode.

The OLED is classified into a bottom emission type and a top emission type according to directions of light emitted from the organic emission layer.

In both the bottom and top emission type OLEDs, the light is emitted from the organic emission layer to the outside via many layers having different indices of refraction. Because these layers have different indices of refraction, the light is scattered and the brightness is lowered. If the emission is set for high brightness to increase the brightness, the power consumption increases and deterioration of an optical device is accelerated.

BRIEF SUMMARY OF THE INVENTION

Exemplary embodiments provide a display device and a fabricating method thereof, in which brightness is improved by decreasing a scattering effect.

An exemplary embodiment provides a display device including a insulating substrate, an organic layer disposed on the insulating substrate, a common electrode disposed on the organic layer and a bead layer including a plurality of beads through which light from the organic layer passes.

In an exemplary embodiment, the bead layer is disposed on the common electrode.

In an exemplary embodiment, the common electrode comprises a plurality of transparent electrode layers and the bead layer is interposed between the transparent electrode layers.

In an exemplary embodiment, the beads have a refractive index of about 1.5 to about 2.0.

In an exemplary embodiment, the beads are hemispherical-shaped.

In an exemplary embodiment, the beads have a diameter of about 2 micrometers ($\mu m$) to about 10 micrometers ($\mu m$).

In an exemplary embodiment, the beads have a height of 2 micrometers ($\mu m$) to about 6 micrometers ($\mu m$).

In an exemplary embodiment, the beads comprise one of polystyrene, polycarbonate, $SiO_2$, $TiO_2$ and a combination including at least one of the foregoing.

In an exemplary embodiment, the common electrode comprises a double layer, and an upper layer of the double layer comprises indium tin oxide ("ITO") or indium zinc oxide ("IZO").

In an exemplary embodiment, the upper layer has a thickness of about 0.03 micrometer ($\mu m$) through 1.5 micrometers ($\mu m$).

In an exemplary embodiment, the display device further comprises a passivation layer disposed on the common electrode and having a refractive index of about 1.3 to about 2.0.

Another exemplary embodiment provides a method of fabricating a display device, the method including forming an organic film on a insulating substrate, forming a first transparent electrode layer on the organic film and forming a bead layer having a plurality of beads on the first transparent electrode layer.

In an exemplary embodiment, the forming a bead layer includes spraying the plurality of beads on the first transparent electrode layer.

In an exemplary embodiment, the forming a bead layer comprises screen printing.

In an exemplary embodiment, the method further comprises forming a second transparent layer on the bead layer.

In an exemplary embodiment, the method further comprises forming a passivation film on the second transparent electrode layer.

An exemplary embodiment provides a method of fabricating a display device, the method including forming an organic film on a insulating substrate, forming a first transparent electrode layer and a second transparent electrode layer on the organic film and forming a bead layer having a plurality of beads on the second transparent electrode layer.

In an exemplary embodiment, the forming a bead layer includes spraying the plurality of beads on the second transparent electrode layer.

In an exemplary embodiment, the forming a bead layer includes screen printing.

In an exemplary embodiment, the method further comprises forming a passivation film on the bead layer.

BRIEF DESCRIPTION OF THE DRAWINGS

The above and/or other aspects and advantages of the present invention will become apparent and more readily appreciated from the following description of the embodiments, taken in conjunction with the accompany drawings of which.

DETAILED DESCRIPTION OF THE INVENTION

Figure 1:
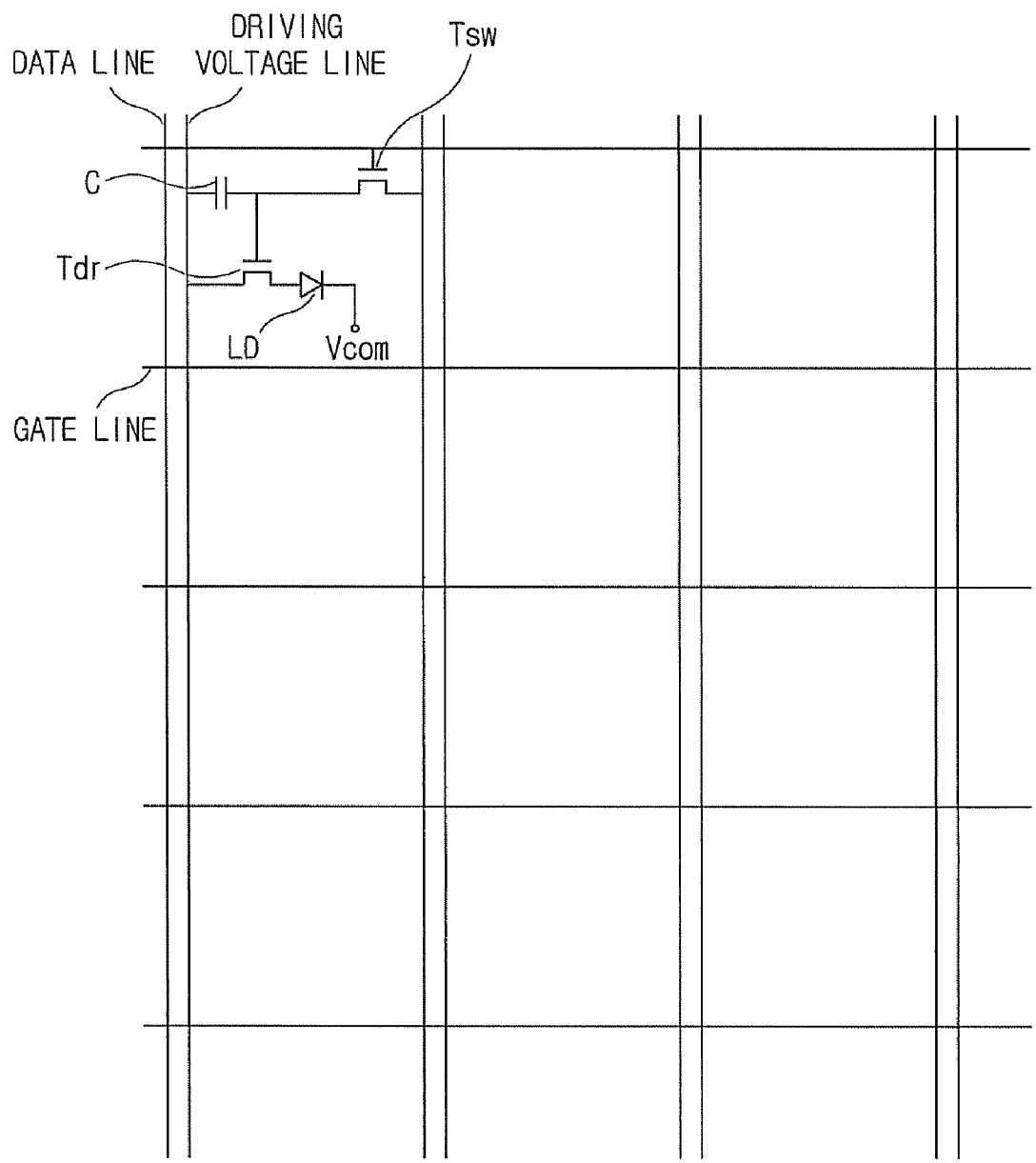
FIG. 1 is an equivalent circuit diagram of an exemplary embodiment of a display device according to the present invention.

Hereinafter, embodiments of the present invention will be described with reference to accompanying drawings, wherein like numerals refer to like elements and repetitive descriptions will be avoided as necessary. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "above", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "above" or "upper" relative to other elements or features would then be oriented "below" or "lower" relative to the other elements or features. Thus, the exemplary term "above" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is an equivalent circuit diagram of an exemplary embodiment of a display device according to the present invention.

Referring to FIG. 1, a display device 1 includes a plurality of signal lines. The signal lines include a gate line to transmit a scan signal, a data line to transmit a data signal, and a driving voltage line to apply a driving voltage. The data line and the driving voltage line are adjacent to and arranged substantially in parallel with each other. Further, the gate line intersects both the data line and the driving voltage line. Adjacent gate lines are arranged substantially in parallel with each other and substantially perpendicular to the data line and driving voltage line.

A pixel includes an organic light emitting device LD, a switching transistor Tsw, a driving transistor Tdr and a capacitor C.

The driving transistor Tdr has a control terminal connected to the switching transistor Tsw, an input terminal connected to the driving voltage line and an output terminal connected to the organic light emitting device LD.

The organic light emitting device LD has an anode connected to the output terminal of the driving transistor Tdr and a cathode connected to a common voltage Vcom. The organic light emitting device LD emits light with brightness varying according to the intensity of a current outputted from the driving transistor Tdr, thereby displaying images. The intensity of the current outputted from the driving transistor Tdr varies according to voltages applied between the control terminal and the output terminal of the driving transistor Tdr.

The switching transistor Tsw has a control terminal connected to the gate line, an input terminal connected to the data line, and an output terminal connected to the control terminal of the driving transistor Tdr. The switching transistor Tsw transmits the data signal from the data line to the driving transistor Tdr in response to the scan signal applied to the gate line.

The capacitor C is connected between the control terminal and the input terminal of the driving transistor Tdr. The capacitor C stores and maintains the data signal to be inputted to the control terminal of the driving transistor Tdr.

An exemplary embodiment of the display device and a fabricating method thereof will be described with reference to FIGS. 2 through 6.

Figure 2A:
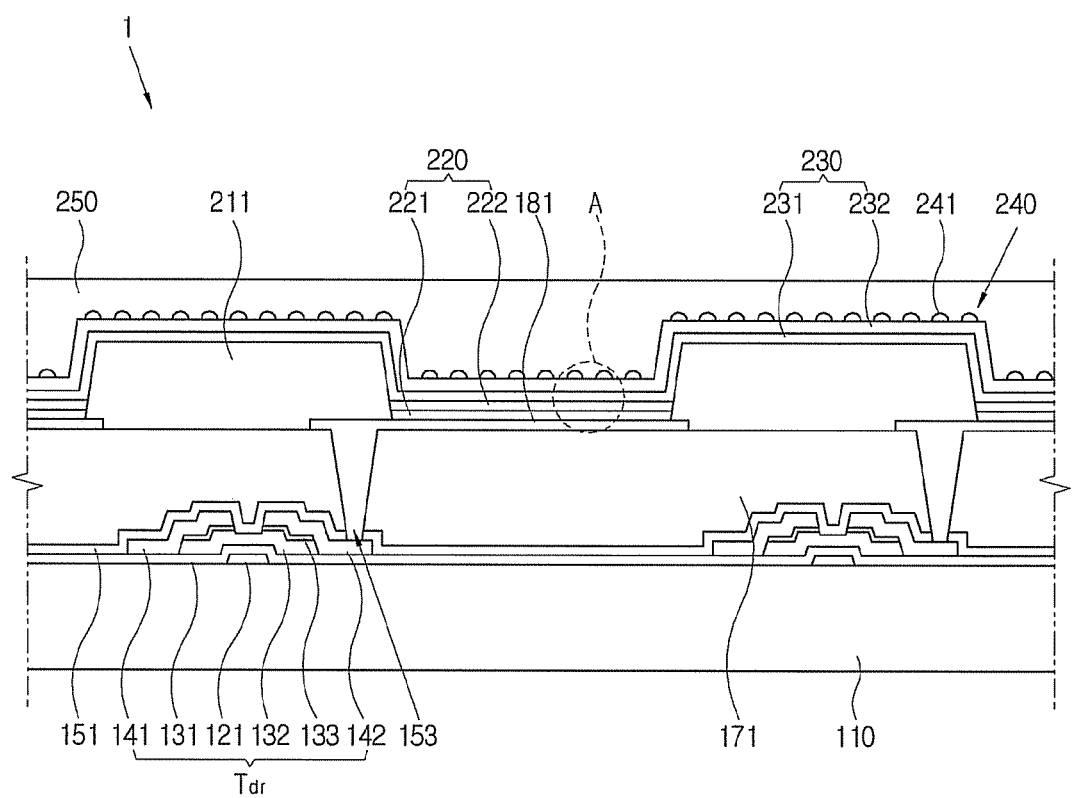
FIGS. 2A and 2B are cross-sectional views of the display device in FIG. 1.
Figure 2B:
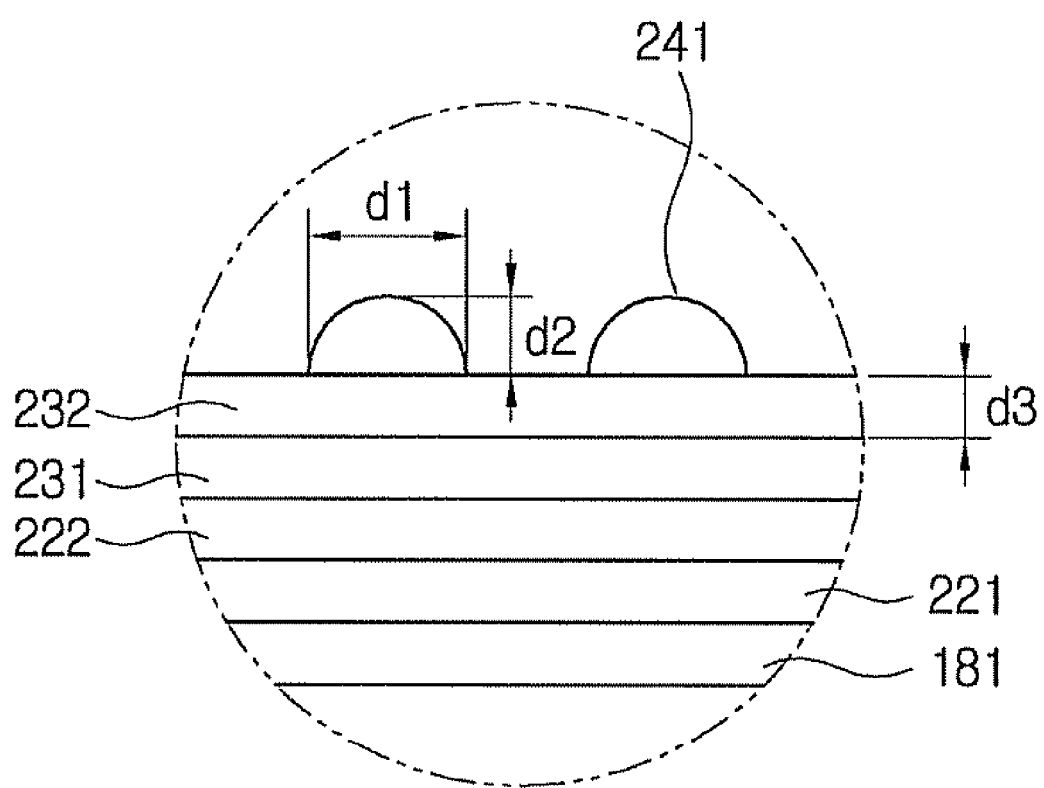

FIGS. 2A and 2B are a cross-sectional views of the display device, which illustrates only the driving transistor Tdr. FIG. 2B is a partial enlargement view of "A" in FIG. 2A.

A first substrate 110 may include an insulating material such as glass, quartz, plastic or the like. A gate electrode 121 is formed on the insulating substrate 110. A gate insulating layer 131 formed on the insulating substrate 110 and the gate electrode 121. In exemplary embodiments, the gate insulating layer 131 may include silicon nitride (SiNx) or the like.

A semiconductor layer 132 and an ohmic contact layer 133 are formed in sequence on the gate insulating film layer 131 corresponding in location and/or dimension to the gate electrode 121. In exemplary embodiments, the semiconductor layer 132 may include amorphous silicon and the ohmic contact layer 133 may include n+ amorphous hydrogenated silicon highly doped with a n-type dopant. The ohmic contact layer 133 is effectively separated into two parts with respect to the gate electrode 121.

As in the illustrated embodiment of FIG. 2A, a source electrode 141 and a drain electrode 142 are each formed on the ohmic contact layer 133 and the gate insulating layer 131. The source electrode 141 and the drain electrode 142 are effectively separated with respect to the gate electrode 121.

A passivation film 151 is formed on the source electrode 141, the drain electrode 142 and an upper part of the semiconductor layer 132 exposed between the source and drain electrodes 141 and 142. In exemplary embodiments, the passivation film 151 may include silicon nitride (SiNx). The passivation film 151 is partially removed on the drain electrode 142.

An organic film 171 is provided on the passivation film 151 covering the thin film transistor Tdr. An upper surface of the organic film 171 is approximately flat and partially removed on the drain electrode 142. In exemplary embodiments, the organic film 171 may include one of benzocyclobutene (BCB) series, olefin series, acrylic resin series, polyimide series, Teflon series, cytop series, perfluorocyclobutane series and any combination including at least one of the foregoing.

A pixel electrode 181 is formed on the organic film 171. The pixel electrode 181 may be considered an anode and supplies holes to an organic layer 220. In exemplary embodiments of a top-emission type display device 1, the pixel electrode 181 supplying the holes may include opaque metal such as nickel (Ni), chrome (Cr), etc. The metal used for the pixel electrode 181 has a high work function to smoothly inject the holes efficiently, but is not limited thereto. The pixel electrode 181 is connected to the drain electrode 142 through a contact hole 153.

In alternative exemplary embodiments, the pixel electrode 181 may include a transparent conductive material such as may be found in a common electrode 230. Where the pixel electrode 181 includes the transparent conductive material, the light may be not emitted toward the common electrode 230 such as in the illustrated exemplary embodiment, but emitted toward opposite directions of the insulating substrate 110.

A partition wall 211 is formed on the pixel electrode 181 and the organic film 171 and surrounds the pixel electrode 181. The partition wall 211 divides the pixel electrodes 181 and defines a pixel region. The partition wall 211 reduces the chance of or effectively prevents the source and drain electrodes 141 and 142 of the thin film transistor Tdr from being short-circuited with the common electrode 230.

In an exemplary embodiment, the partition wall 211 may include, but is not limited to a photosensitive material such as an acrylic resin, a polyimide resin, etc., which has heat resistance and solvent resistance. In another exemplary embodiment, the partition wall 211 may include an inorganic material such as $SiO_2$ and/or $TiO_2$. The partition wall 211 may have a double structure of an organic layer and an inorganic layer.

An organic layer 220 is formed on the pixel electrode 181 which is not covered with the partition wall 211. The organic layer 220 includes a hole injecting layer 221 and an emission layer 222.

In exemplary embodiments, the hole injecting layer 221 may include a hole injecting material such as poly(3,4-ethylenedioxythiophene) ("PEDOT") and polystyrene sulfonic acid ("PSS"). The hole injecting materials may be inkjetted in an aquatic suspension state, to form the hole injecting layer 221.

In exemplary embodiments, the emission layer 222 may include three sub-layers emitting red, green and blue respectively. Each pixel may include one of the three sub-layers.

A hole from the pixel electrode 181 and an electron from the common electrode 230 are combined into an exciton in the emission layer 222 and light is emitted while the exciton is inactivated.

The common electrode 230 is provided on the partition wall 211 and the emission layer 222. The common electrode 230 is essentially used as a cathode to supply the electron to an emission layer 222. The common electrode 230 includes a plurality of transparent electrode layers 231 and 232. The first transparent electrode layer 231 may include metal having a low work function to supply the electron to the emission layer 222 and the second transparent electrode layer 232 may include a transparent conductive material to cap the first transparent electrode layer 231.

In exemplary embodiments, the first transparent layer 231 may include, but is not limited to, an alloy of magnesium and silver or an alloy of calcium and silver. In one exemplary embodiment, the thickness of the first transparent layer 231 may range from about 50 nanometers (nm) to about 200 nanometers (nm). When the thickness of the first transparent electrode 231 is less than 50 nm, resistance increases excessively, so that a common voltage is not applied efficiently. On the other hand, when the thickness of the first transparent electrode 231 is more than 200 nm, the common electrode 230 may be opaque.

In exemplary embodiments, the second transparent layer 232 may include, but is not limited to, indium tin oxide ("ITO") or indium zinc oxide ("IZO"). In exemplary embodiments, a thickness d3 of the second transparent layer 232 may range from about 0.03 micrometer (μm) to about 1.5 micrometers (μm). In one exemplary embodiment, the refractive index of ITO or IZO ranges from about 1.7 to about 1.9.

On the second transparent layer 232 is formed a bead layer 240 having a plurality of beads 241. Each bead 241 has a substantially hemispherical shape and effectively acts as a lens for scattering incident light. The bead 241 enhances the diffusion of the light passed through the common electrode 230. The bead layer 240 is effectively used as a diffuser sheet and/or a prism sheet of a liquid crystal display ("LCD"), thereby enhancing the diffusion of the light.

Referring to FIG. 2B, the bead 241 contacting the second transparent electrode layer 232 may have a bottom diameter d1. In an exemplary embodiment, the bottom diameter d1 may range from about 2 μm to about 10 μm. A height d2 of the bead 241 may range from about 2 μm to about 6 μm. A plurality of beads 241 is provided per pixel, for which the size of the bead 241 can vary according to the size of the pixel.

In an exemplary embodiment the bead 241 may include, but is not limited to, polystyrene which may be found in a spacer of the LCD and/or include at least one of polycarbonate, $SiO_2$ and $TiO_2$.

The bead 241 may include any of a number of various materials so long as it can be formed to have a substantially hemispherical shape. In one exemplary embodiment, the refractive index of the bead 251 may range from about 1.5 to 2.0.

As the bead layer 240 is in contact with the second transparent electrode layer 232, the bead 241 preferably has a refractive index similar to the refractive index of the second transparent electrode layer 232. If the bead 241 and the second transparent electrode layer 232 are largely different in refractive indices, the light having an angle of incidence larger than a critical angle undergoes total internal reflection without being emitted to the outside. When the total internal reflection occurs, the bead layer 240 cannot diffuse the light sufficiently. In exemplary embodiments, the refractive index of the bead 241 is equal to or substantially similar to that of the second transparent electrode layer 232.

A passivation layer 250 is provided on the bead layer 240 for protecting the bead layer 240. In an exemplary embodiment, the refractive index of the passivation layer 250 is preferably similar to that of the second transparent layer 232, thereby efficiently transmitting the light. In one exemplary embodiment, the refractive index of the passivation layer 250 ranges from about 1.3 to about 2.0. The passivation layer 250 may include, but is not limited to, at least one of polycarbonate, $SiO_2$ and $TiO_2$. In an alternative exemplary embodiment, the passivation layer 250 may be formed by coating a separate film.

Figure 3:
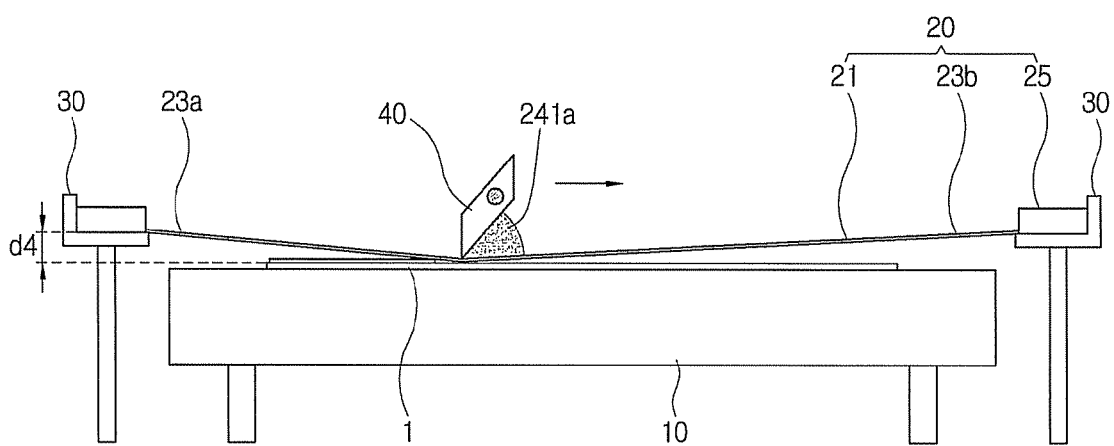
FIG. 3 illustrates an exemplary embodiment of a screen printing apparatus used in fabricating a display device according to the present invention.
Figure 4:
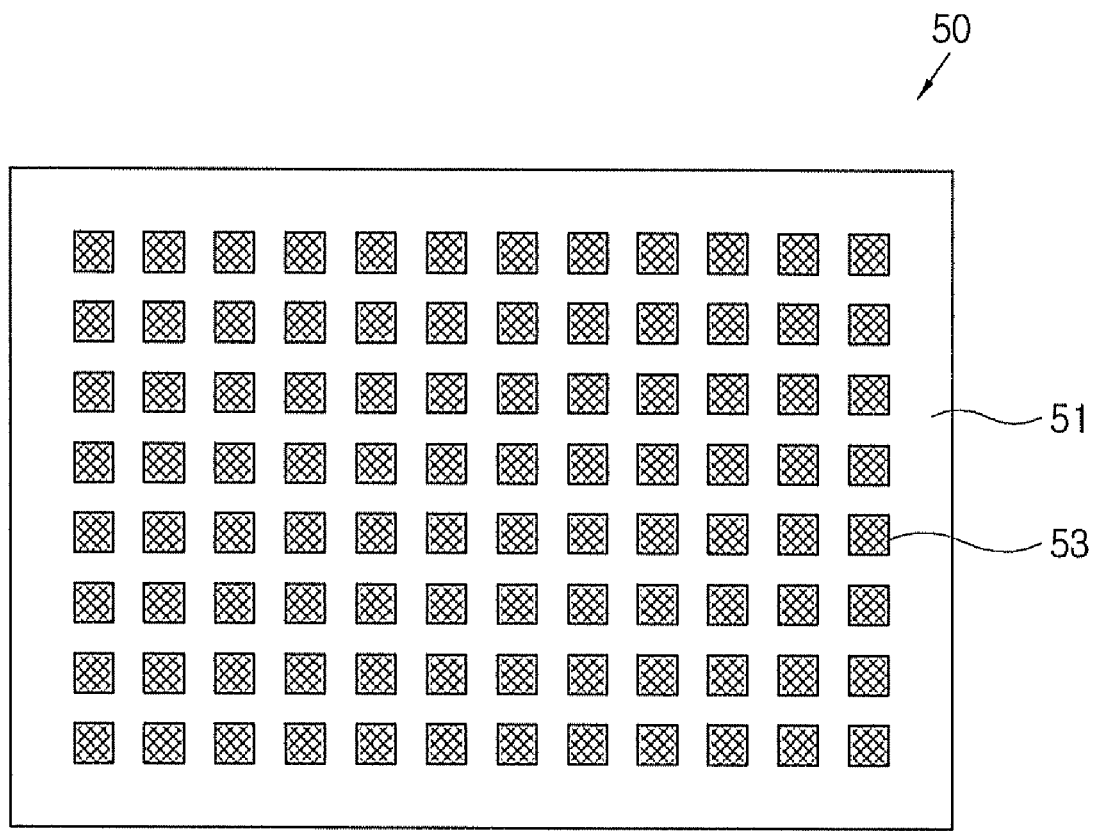
FIG. 4 illustrates an exemplary embodiment of a screen mask used in fabricating a display device according to the present invention.
Figure 5:
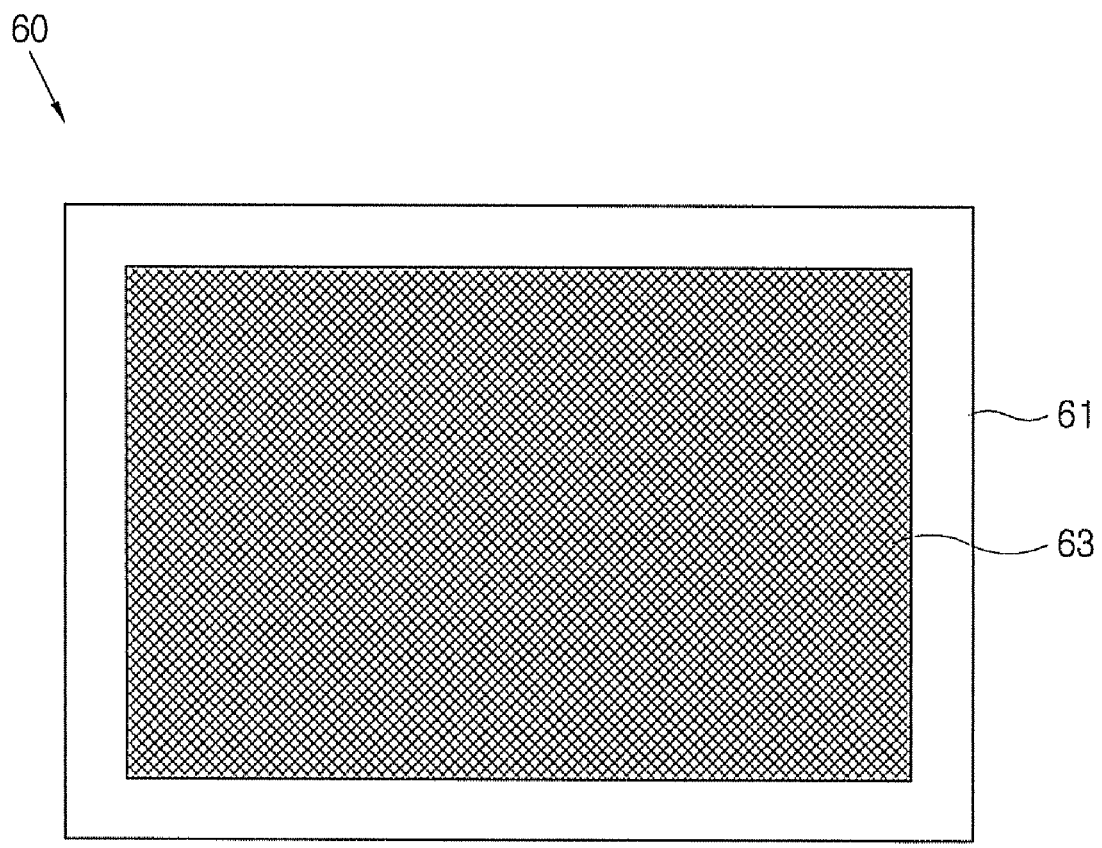
FIG. 5 illustrates another exemplary embodiment of a screen mask used in fabricating a display device according to the present invention.
Figure 6:
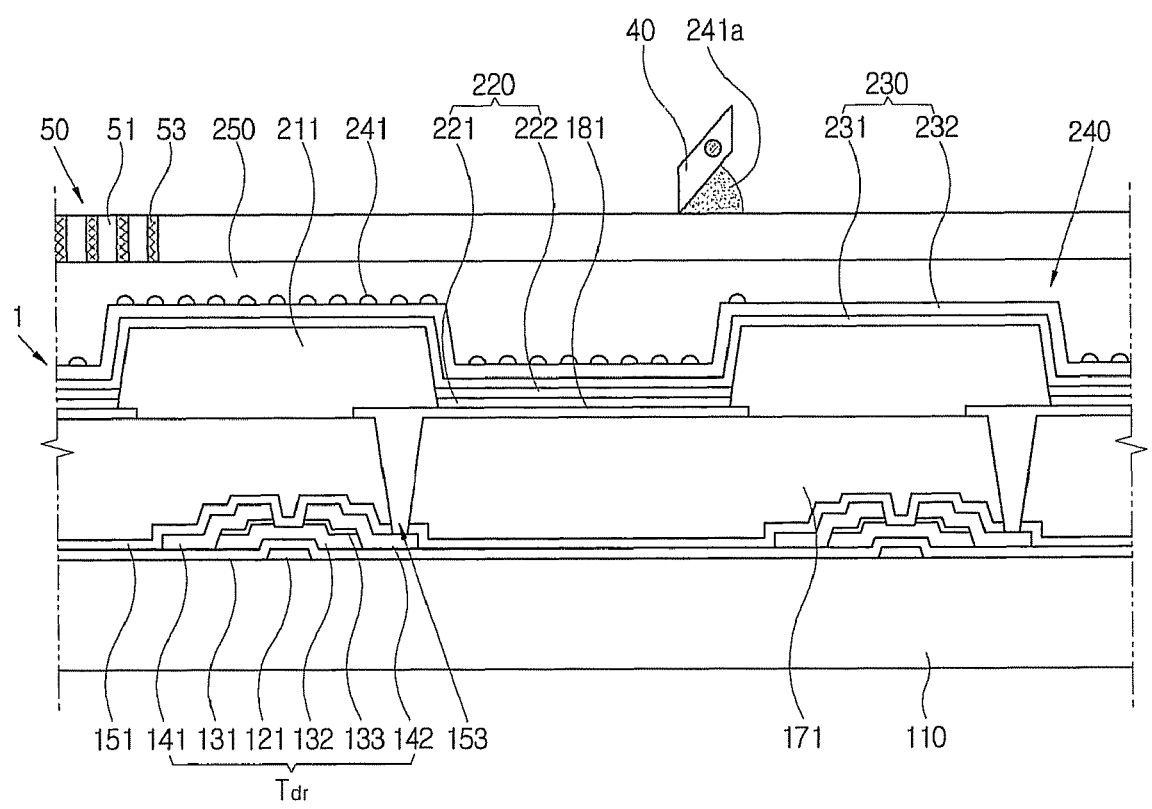
FIG. 6 is a cross-sectional view illustrating an exemplary embodiment of a method of fabricating a display device according to the present invention.

FIG. 3 illustrates an exemplary embodiment of a screen printing apparatus used in fabricating a display device according to the present invention, in particular, fabricating the bead layer 240 and the passivation layer 250, FIG. 4 illustrates an exemplary embodiment of a screen mask used in fabricating the bead layer, FIG. 5 illustrates another exemplary embodiment of a screen mask used in fabricating a display device according to the present invention, and FIG. 6 is a cross-sectional view illustrating an exemplary embodiment of a method of fabricating a display device according to the the present invention.

Referring to FIG. 3, a screen printing apparatus includes a table 10 on which the display device 1 is seated, a screen mask 20 placed on the table 10, a mask holder 30 supporting at least one side of the screen mask 20 and spacing the screen mask 20 from the table 1, a squeeze 40 scanning the screen mask 20 and a controller (not shown) controlling a squeeze driver (not shown) to linearly move the squeeze 40 from one side to the other side of the screen mask 20.

The display device 1 is seated on the table 10 and the screen mask 20 is placed above the display device 1. The screen mask 20 includes a printing part 21 corresponding to the display device 1 supporters 23a and 23b surrounding the printing part 21 and a mask frame 25 provided on at least one side of the supporters 23a, 23b and holding the screen mask 20. The size and the shape of the printing part 21 substantially corresponds to those of the display device 1. In an exemplary embodiment, the printing part 21 may have a substantially rectangular shape.

In exemplary embodiments, the supporters 23a, 23b are made of a flexible material such as plastics, and are provided at the edges of the printing part 21, thereby essentially pulling the printing part 21 to reduce or effectively prevent sagging of the printing part 21. The supporters 23a, 23b move up and down along with the printing part 21 as the squeeze 40 presses the printing part 21. The mask frame 25 is seated on the mask holder 30 (to be described later) and the mask holder 30 supports the screen mask 20 to reduce or effectively prevent movement of the screen mask 20 while the squeeze 40 operates.

The mask holders 30 are provided in the opposite sides of the table 10 and face each other. The mask holders 30 hold and support the screen mask 20 while the squeeze 40 operates and space the screen mask 20 from the display device 1 at a predetermined distance. Here, a gap d4 between the screen mask 20 and the display device 1 may vary according to the size of the display device 1. In one exemplary embodiment, the gap d4 may be about 5 centimeters (cm) to about 30 centimeters (cm).

The squeeze 40 scans the screen mask 20 and squeezes out a printing substance 241a onto the display device 1 through the printing part 21. The printing substance may include, but is not limited to, polycarbonate or the like.

The squeeze 40 moves, such as linearly, from a first supporting end 23a of the screen mask 20 to a second supporting end 23b opposite to the first supporting end 23a, and spreads polycarbonate 241a stacked in the first supporting end 23a onto the printing part 21. At the same time, the squeeze 40 presses the printing part 21 toward the display device 1 and squeezes polycarbonate 241a from the printing part 21 out onto the display device 1. The printing part 21 pressed by the squeeze 40 is transformed to approach the display device 1, and then returns to be spaced from the substrate 100 after the squeeze 40 passes therethrough.

The screen mask 50 used in forming the bead layer 240, such as shown in FIG. 4, is provided with a mesh pattern 53 and a blocking pattern 51. In an exemplary embodiment, the mesh pattern 53 and the blocking pattern 51 may be provided at substantially regular intervals. The mesh pattern 53 may be formed in any of a number of shapes as is suitable for forming the bead layer 240, such as a substantially rectangular shape. In one exemplary embodiment, the rectangular mesh pattern 53 is formed with a mesh so that polycarbonate 241a can pass therethrough during forming of the bead layer 240, such as by screen printing. The printing substance cannot pass through the blocking pattern 51. As illustrated in the embodiment of FIG. 4, the mesh patterns 53 are spaced apart from each other at predetermined intervals in a substantially matrix shape.

The screen mask 60 used in forming the passivation layer 250 shown in FIG. 5 is provided with a mesh pattern 63 and a blocking pattern 61. Because the passivation layer 250 is deposited essentially on the entire surface of the display device 1 without a predetermined pattern, the mesh pattern 63 occupies most of the screen mask 60.

FIG. 6 illustrates an exemplary embodiment of a method of fabricating a display device, including the bead layer 240, such as by screen printing. The screen mask 50 shown in FIG. 4 is placed on the display device 1, and the squeeze 40 moves in one direction, such as from left to right. The screen mask 50 is densely formed with the mesh patterns 53.

The squeeze 40 moves on the screen mask 50 and squeezes polycarbonate 241a out onto the display device 1 through the mesh pattern 53.

In an exemplary embodiment, a plurality of beads 241 is formed in a region corresponding to one pixel electrode 181. Therefore, a plurality of mesh patterns 53 is formed in a region corresponding to the pixel electrode 181. Polycarbonate 241a squeezed from the mesh pattern 53 to the first transparent electrode layer 232 is processed, such as hardened, and formed to have substantially a hemispherical shape.

In exemplary embodiments, to harden polycarbonate 241a, ultraviolet ("UV") ray or heat may be applied to the polycarbonate 241a.

After forming the bead layer 240, the passivation layer 250 is formed on the bead layer 240 by the squeeze 40 and the screen mask 60 of FIG. 5. In an exemplary embodiment, the passivation layer 250 includes an inorganic material or an inorganic insulating material.

In an alternative exemplary embodiment, the passivation layer 250 may be formed by a deposition method such as a sputtering method or a chemical vapor deposition ("CVD") method.

In another alternative exemplary embodiment, like the bead layer 240 and the passivation layer 250, the emission layer 222 and the organic layer 220 may be formed by the screen printing method.

In another exemplary embodiment, like a spacer for an LCD, the bead layer 240 may be formed by spraying the beads 241 without using the squeeze 40.

Figure 7:
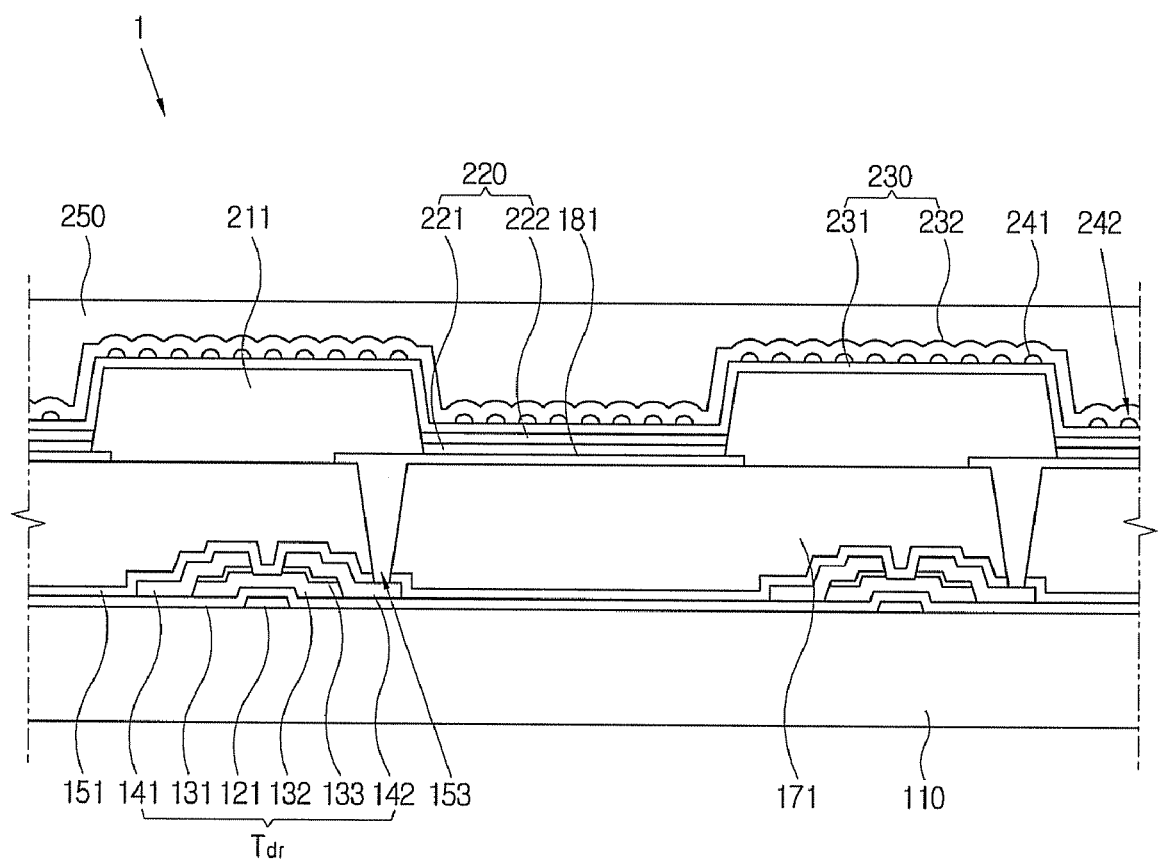
FIG. 7 is a cross-sectional view of another exemplary embodiment of a display device according to the present invention.

FIG. 7 is a cross-sectional view of another exemplary embodiment of a display device according to the present invention. The display device includes a bead layer 242 interposed between a first transparent electrode layer 231 and a second transparent electrode layer 232.

Like the bead layer 240 of FIGS. 1-6, the bead layer 242 has a refractive index similar to that of the second transparent electrode layer 232. In an exemplary embodiment, the bead layer 242 may be formed by spraying the bead 241 on the first transparent electrode layer 231 or using a squeeze 40.

In the illustrated exemplary embodiments, by forming the bead layer 240, 242, the amount of light passing through the common electrode 230 and traveling substantially straight is increased and surface-reflected light is diffused. Advantageously, the scattered light decreases and the brightness increases, thereby reducing power consumption as compared with the case where there is no bead layer 240, 242.

The illustrated exemplary embodiments provide a display device and a fabricating method thereof, in which brightness is improved by decreasing a scattering effect.

The illustrated exemplary embodiments provide a display device and a fabricating method thereof, in which power consumption is reduced.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device comprising
an insulating substrate;
an organic layer disposed on the insulating substrate;
a common electrode disposed on the organic layer; and
a bead layer comprising a plurality of beads through which light from the organic layer passes,
wherein the common electrode comprises a plurality of transparent electrode layers, and the bead layer is interposed between the transparent electrode layers of the common electrode.

2. The display device according to claim 1, wherein the beads have a refractive index of about 1.5 to about 2.0.

3. The display device according to claim 2, further comprising a passivation layer disposed on the common electrode and having a refractive index of about 1.3 to about 2.0.

4. The display device according to claim 2, wherein the common electrode comprises a double layer and an upper layer of the double layer comprises indium tin oxide ("ITO") or indium zinc oxide ("IZO").

5. The display device according to claim 4, wherein the upper layer has a thickness of about 0.03 micrometers (μm) to about 1.5 micrometers (μm).

6. The display device according to claim 1, wherein the beads comprise one of polystyrene, polycarbonate, $SiO_2$, $TiO_2$ and a combination comprising at least one of the foregoing.

7. The display device according to claim 1, wherein the beads are hemispherical-shaped.

8. The display device according to claim 7, wherein the beads have a diameter of about 2 micrometers (μm) to about 10 micrometers (μm).

9. The display device according to claim 7, wherein the beads have a height of about 2 micrometers (μm) to about 6 micrometers (μm).

10. A method of fabricating a display device, the method comprising;
forming an organic film on a insulating substrate;
forming a first transparent electrode layer on the organic film;
forming a bead layer comprising a plurality of beads on the first transparent electrode layer, and
forming a second transparent electrode layer on the bead layer.

11. The method according to claim 10, wherein the forming a bead layer comprises spraying the plurality of beads on the first transparent electrode layer.

12. The method according to claim 10, wherein the forming a bead layer comprises screen printing.

13. The method according to claim 10, further comprising:
forming a passivation film on the second transparent electrode layer.

14. A method of fabricating a display device, the method comprising:
forming an organic film on a insulating substrate;
forming a first transparent electrode layer and a second transparent electrode layer on the organic film; and
forming a bead layer comprising a plurality of beads on the second transparent electrode layer.

15. The method according to claim 14, wherein the forming a bead layer comprises spraying the plurality of beads on the second transparent electrode layer.

16. The method according to claim 14, wherein the forming a bead layer comprises screen printing.

17. The method according to claim 14, further comprising:
forming a passivation film on the bead layer.

* * * * *